(12) United States Patent
Xiong et al.

(10) Patent No.: US 8,377,772 B2
(45) Date of Patent: Feb. 19, 2013

(54) CMOS INTEGRATION METHOD FOR OPTIMAL IO TRANSISTOR $V_T$

(75) Inventors: Weize Xiong, Plano, TX (US); Greg Charles Baldwin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 199 days.

(21) Appl. No.: 12/857,954

(22) Filed: Aug. 17, 2010

(65) Prior Publication Data

US 2012/0045874 A1 Feb. 23, 2012

(51) Int. Cl.
*H01L 21/8238* (2006.01)
*H01L 21/8234* (2006.01)
*H01L 21/8236* (2006.01)
*H01L 21/336* (2006.01)

(52) U.S. Cl. ........ 438/217; 438/275; 438/276; 438/289; 257/E21.633; 257/E21.689; 257/E21.691

(58) Field of Classification Search .................. 438/217, 438/275, 276, 289; 257/E21.633, E21.689, 257/E21.691
See application file for complete search history.

(56) References Cited

U.S. PATENT DOCUMENTS

| | | | | |
|---|---|---|---|---|
| 5,036,018 A | * | 7/1991 | Mazzali | 438/201 |
| 5,182,719 A | * | 1/1993 | Kuroda et al. | 438/129 |
| 5,550,072 A | * | 8/1996 | Cacharelis et al. | 438/201 |
| 5,989,949 A | * | 11/1999 | Kim et al. | 438/217 |
| 6,143,594 A | * | 11/2000 | Tsao et al. | 438/199 |
| 6,329,218 B1 | * | 12/2001 | Pan | 438/57 |
| 6,455,402 B2 | * | 9/2002 | Lee et al. | 438/527 |
| 6,861,341 B2 | * | 3/2005 | Chen et al. | 438/527 |
| 7,135,738 B2 | * | 11/2006 | Williams et al. | 257/328 |
| 2002/0140047 A1 | * | 10/2002 | Cappelletti et al. | 257/500 |
| 2007/0298571 A1 | * | 12/2007 | Park et al. | 438/275 |

* cited by examiner

*Primary Examiner* — Charles Garber
*Assistant Examiner* — Ron Pompey
(74) *Attorney, Agent, or Firm* — Jacqueline J. Garner; Wade J. Brady, III; Frederick J. Telecky, Jr.

(57) ABSTRACT

Various embodiments provide methods for fabricating dual supply voltage CMOS devices with a desired I/O transistor threshold voltage. The dual supply voltage CMOS devices can be fabricated in a semiconductor substrate that includes isolated regions for a logic NMOS transistor, a logic PMOS transistor, an I/O NMOS transistor, and an I/O PMOS transistor. Specifically, the fabrication can first set and/or adjust the threshold voltage ($V_T$) of each of the I/O NMOS transistor and the I/O PMOS transistor to a desired level. Logic NMOS and logic PMOS transistors can then be formed with I/O NMOS and I/O PMOS transistors masked without affecting the set/adjusted $V_T$ of the I/O transistors.

16 Claims, 4 Drawing Sheets

CMOS INTEGRATION METHOD FOR OPTIMAL IO TRANSISTOR $V_T$

FIELD OF THE INVENTION

The invention relates generally to CMOS semiconductor devices and, more specifically, to methods of forming dual supply voltage CMOS devices with optimal threshold voltage for I/O transistors.

BACKGROUND OF THE INVENTION

A semiconductor device chip often has two types and/or sizes of complementary metal-oxide semiconductor (CMOS) transistors on a single chip. One type is typically adapted for operation at a low supply voltage and another type typically adapted for operation at a higher supply voltage.

The low supply voltage transistors, referred to herein as the logic or core transistors, are used internal to the chip. Logic transistors are usually in the central part of the chip and are optimized for high packing density and performance. Logic transistors are smaller and have a thin gate oxide layer to maximize speed at low voltages.

The high supply voltage transistors are usually used to communicate to external devices/chips and are hence referred to as I/O (input/output) transistors. These transistors are larger, and have a thicker gate oxide layer for reliable high voltage operation. The use of two different supply voltages requires two different gate oxide thicknesses. For example, I/O transistors can often have a gate oxide thickness 2 to 4 times thicker than logic transistors.

Variations between implants received by the logic transistors and the I/O transistors require the use of two separate sets of masks. Optimizing both sets requires 4-5 additional masks. Tests using identical implants for both the low voltage and high voltage transistors, while preferable from a fabrication standpoint, do not provide high voltage transistors that meet the necessary lifetime and performance specifications. The high doping necessary for the logic transistors causes the periphery I/O transistors to have too high an electrical field, even though the oxide thickness is increased for these transistors. As a result, while the logic transistor threshold voltage ($V_T$) is at the target value, the I/O transistor threshold voltage ($V_T$) is too high and the I/O transistor's performance degrades.

FIGS. 2A-2D depict conventional methods for forming a semiconductor device having isolated regions of a logic NMOS transistor, a logic PMOS transistor, an I/O NMOS transistor, and an I/O PMOS transistor. In FIG. 2A, a blanket P-type substrate implant 40 is performed to set a threshold voltage ($V_T$) of the I/O NMOS transistor. In FIG. 2B, the conventional 110 PMOS transistor, the logic PMOS transistor, and the I/O NMOS transistor are covered by a photo-resist 50, exposing only the logic NMOS region to form a DNWELL at 55 in the logic NMOS transistor.

In FIG. 2C, when standard NWELL pattern is performed (see 65) to form the logic PMOS transistor, the I/O PMOS transistor is also exposed to the NWELL implant by a photo-resist 60. In FIG. 2D, when the PWELL pattern is performed (see 75) in the conventional logic NMOS transistor by using a photo-resist 70, the I/O NMOS transistor is also exposed to the PWELL implant. This exposure of the I/O NMOS transistor can affect the threshold voltage of the I/O NMOS transistor that are previously set in FIG. 2A.

Thus, there is a need to overcome these and other problems of the prior art and to provide fabrication methods for CMOS devices with suitable I/O transistor threshold voltage ($V_T$) but without using additional masks.

SUMMARY OF THE INVENTION

According to various embodiments, the present teachings include a method of fabricating a CMOS transistor. The method can include providing a semiconductor substrata that includes isolated regions of a logic NMOS transistor, a logic PMOS transistor, an I/O NMOS transistor, and an I/O PMOS transistor. A threshold voltage ($V_T$) of the I/O NMOS transistor can then be set by implanting a P-type dopant in the I/O NMOS transistor; and a threshold voltage ($V_T$) of the I/O PMOS transistor can be set by implanting an N-type dopant in the I/O PMOS transistor. By masking both the I/O NMOS transistor with the set $V_T$ and the I/O PMOS transistor with the set $V_T$, an NWELL region can then be formed in the logic PMOS transistor and a PWELL region can then be formed in the logic NMOS transistor.

According to various embodiments, the present teachings also include a method of fabricating a CMOS transistor. The CMOS transistor can be formed in a semiconductor substrate including isolated regions of a logic NMOS transistor, a logic PMOS transistor, an I/O NMOS transistor, and an I/O PMOS transistor. A blanket implanting of a P-type dopant can be performed in each isolated region of the semiconductor substrate to set a threshold voltage ($V_T$) of the I/O NMOS transistor. A threshold voltage ($V_T$) of the I/O PMOS transistor can be set by implanting an N-type dopant in the I/O PMOS transistor with both the logic PMOS transistor and the I/O NMOS transistor masked. The I/O NMOS transistor with the set $V_T$, the I/O PMOS transistor with the set $V_T$, and the logic NMOS transistor can then be masked to form an NWELL region in the logic PMOS transistor. This is followed by masking the I/O NMOS transistor with the set $V_T$, the I/O PMOS transistor with the set $V_T$, and the logic PMOS transistor to form a PWELL region in the logic NMOS transistor.

According to various embodiments, the present teachings further include a method of fabricating a CMOS transistor. The CMOS transistor can be formed in a semiconductor substrate that includes isolated regions of a logic NMOS transistor, a logic PMOS transistor, an I/O NMOS transistor, and an I/O PMOS transistor. A blanket implanting of boron can be performed in each isolated region of the semiconductor substrate to set a threshold voltage ($V_T$) of the I/O NMOS transistor. The set $V_T$ of the I/O NMOS transistor can be optionally adjusted by a surface boron implant. By masking both the logic PMOS transistor and the I/O NMOS transistor, a deep NWELL can be formed in both the logic NMOS transistor and the I/O PMOS transistor in order to set a threshold voltage ($V_T$) of the I/O PMOS transistor. The set $V_T$ of the I/O PMOS transistor can be optionally adjusted by a surface N-type implant. An NWELL region can be formed in the logic PMOS transistor by masking the I/O NMOS transistor with the set $V_T$, the I/O PMOS transistor with the set $V_T$, and the logic NMOS transistor. A PWELL region can be formed in the logic NMOS transistor by masking the I/O NMOS transistor with the set $V_T$, the I/O PMOS transistor with the set $V_T$, and the logic PMOS transistor.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodi

It should be noted that some details of the figures have been simplified and are drawn to facilitate understanding of the inventive embodiments rather than to maintain strict structural accuracy, detail, and scale.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Various embodiments provide methods for fabricating dual supply voltage CMOS devices with a desired I/O transistor threshold voltage. The dual supply voltage CMOS devices can be fabricated in a semiconductor substrate that includes isolated regions for a logic NMOS transistor, a logic PMOS transistor, an I/O NMOS transistor, and an I/O PMOS transistor. The fabrication of the dual supply voltage CMOS devices can include first setting and/or adjusting the threshold voltage ($V_T$) of each of the I/O NMOS and I/O PMOS transistors to a desired level. Logic NMOS and logic PMOS transistors can then be formed with I/O NMOS and PMOS transistors masked without affecting the set/adjusted $V_T$ of the I/O transistors.

FIGS. 1A-1D depict a portion of an exemplary semiconductor device at various stages of fabrication in accordance with various embodiments of the present teachings. For better understanding the invention, a semiconductor device at various conventional fabrication stages, shown in FIGS. 2A-2D, is provided and discussed with respect to the exemplary embodiment shown in FIGS. 1A-1D.

Figure 1A:
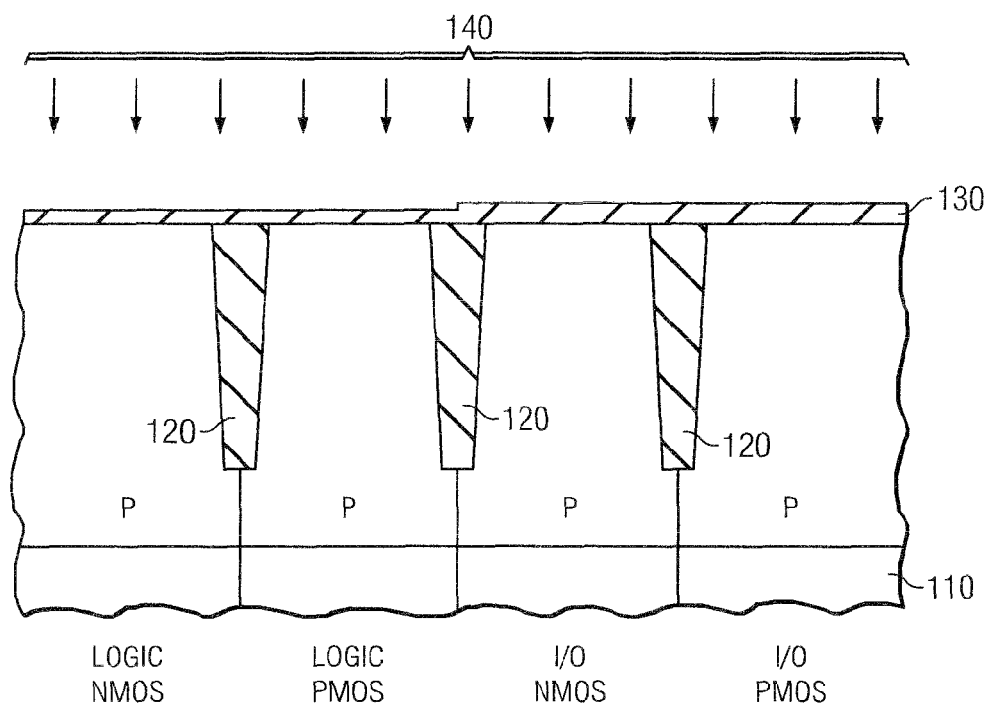
- FIGS. 1A-1D depict a portion of an exemplary semiconductor device at various stages of fabrication in accordance with various embodiments of the present teachings.

As shown in FIG. 1A, the exemplary fabrication process can begin with the formation of isolation structures 120 in a semiconductor substrate 110, for example, a silicon substrate. The isolation structures 120 can be LOCOS (local oxidation of silicon) oxidations, shallow trench isolation (STI), or other schemes known to one of ordinary skill in the art. FIGS. 1A-1D depict STI as an exemplary isolation structure. The substrate 110 in FIG. 1A can therefore include isolated regions for a logic NMOS transistor, a logic PMOS transistor, an I/O NMOS transistor, and/or an I/O PMOS transistor.

Still in FIG. 1A, a thin disposable oxide layer 130 can be generally grown to protect the exemplary silicon surface of the substrate 110 during subsequent implants to form the disclosed CMOS device.

In embodiments, an I/O NMOS $V_T$ implant can be performed in the I/O NMOS transistor to set the threshold voltage ($V_T$) of the I/O NMOS transistor. In one embodiment, at 140 of FIG. 1A, a blanket P-type implant, for example, a blanket PWELL Boron implant, can be performed in each isolated region of the semiconductor substrate 110. The exemplary blanket P-type implant can also be used to isolate the subsequently formed NWELL of I/O NMOS transistor from NWELL of the logic NMOS transistor. The NWELL formation in the I/O NMOS transistor and the logic NMOS transistor can use conventional procedures as known to one of ordinary skill in the art.

Figure 2A:
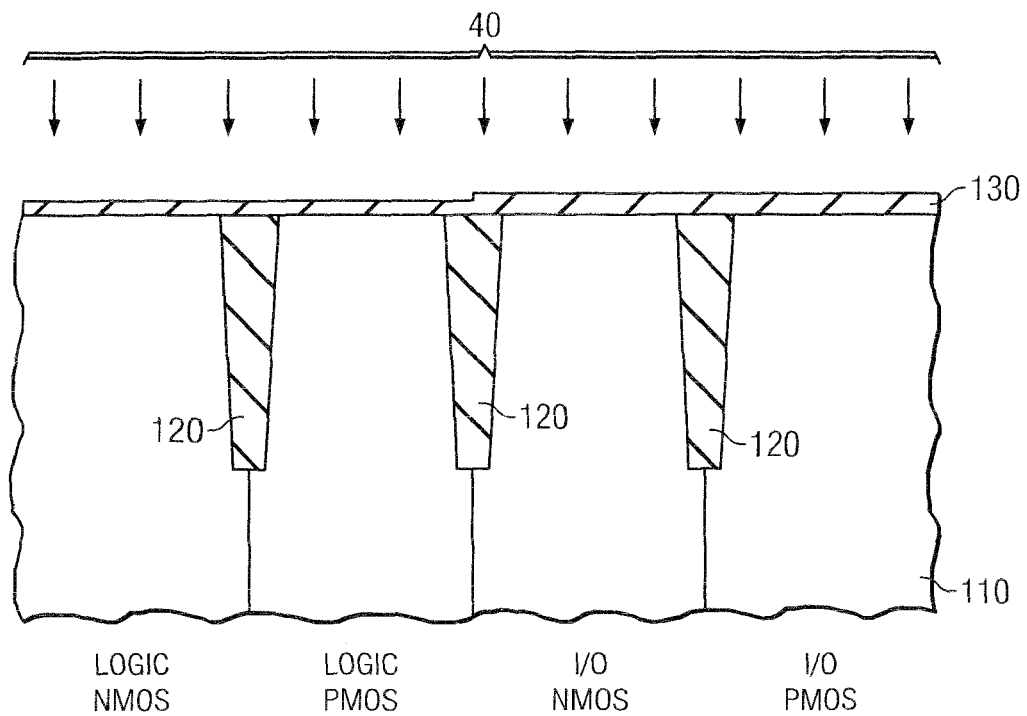
FIGS. 2A-2D depict a portion of a conventional semiconductor device at corresponding fabrication stages to FIGS. 1A-1D.

Note that while the blanket P-type substrate implant 140 can be performed in both cases of FIG. 1A and FIG. 2A, the implant dose, energy, and/or depth of the disclosed device (see FIG. 1A) can be different from the conventional device (see FIG. 2A).

For example, the P-type substrate implant 40 in FIG. 2A for conventional I/O NMOS $V_T$ implant can have an implant dose of about 1e11 atoms/cm$^2$ to about 1e12 atoms/cm$^2$ at an energy of about 300 KeV to about 500 KeV boron to set the threshold voltage $V_T$ of the conventional I/O NMOS transistor at about 0.1V to about 0.2V. In contrast, the blanket P-type substrate implant 140 in FIG. 1A for the disclosed I/O NMOS $V_T$ can have an implant dose of about 1e12 atoms/cm$^2$ to about 1e13 atoms/cm$^2$ at an energy of about 300 KeV to about 500 KeV Boron to set the $V_T$ of the disclosed I/O NMOS transistor at or close to a desired $V_T$ level.

In some embodiments, an additional surface P-type implant can be performed to adjust the $V_T$ of the I/O NMOS transistor set by the blanket P-type implant at 140. In embodiments, the threshold voltage ($V_T$) of the I/O NMOS transistor can be set and/or adjusted to a desired level ranging from about 0.2V to about 1.0V, or from about 0.2V to about 0.7V or from about 0.3 to about 1.0V.

Figure 1B:
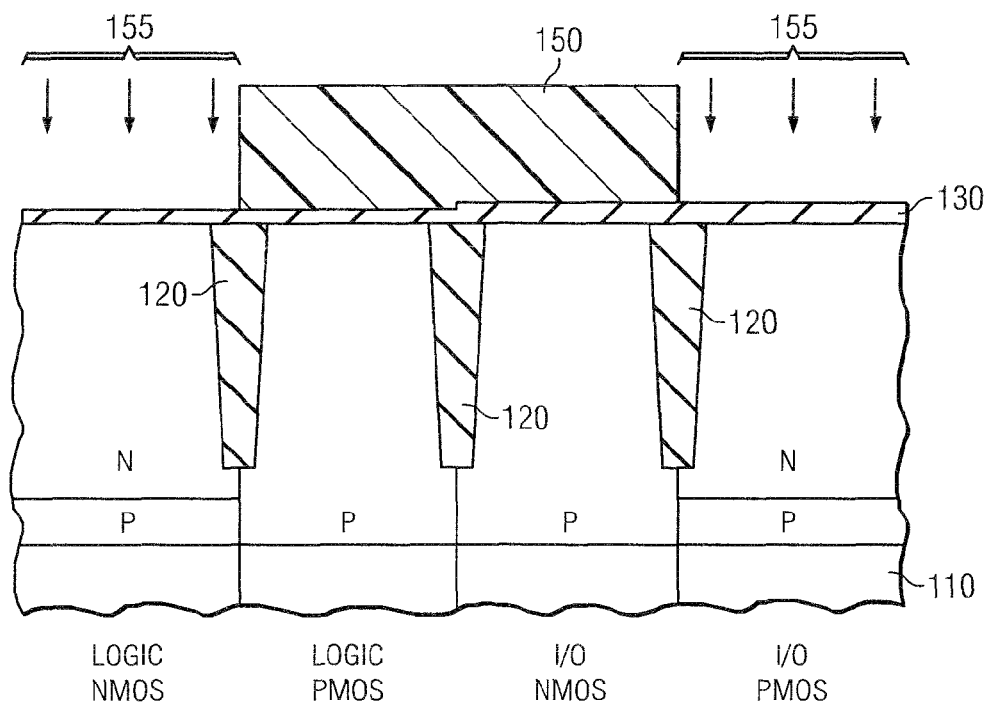
Figure 1C:
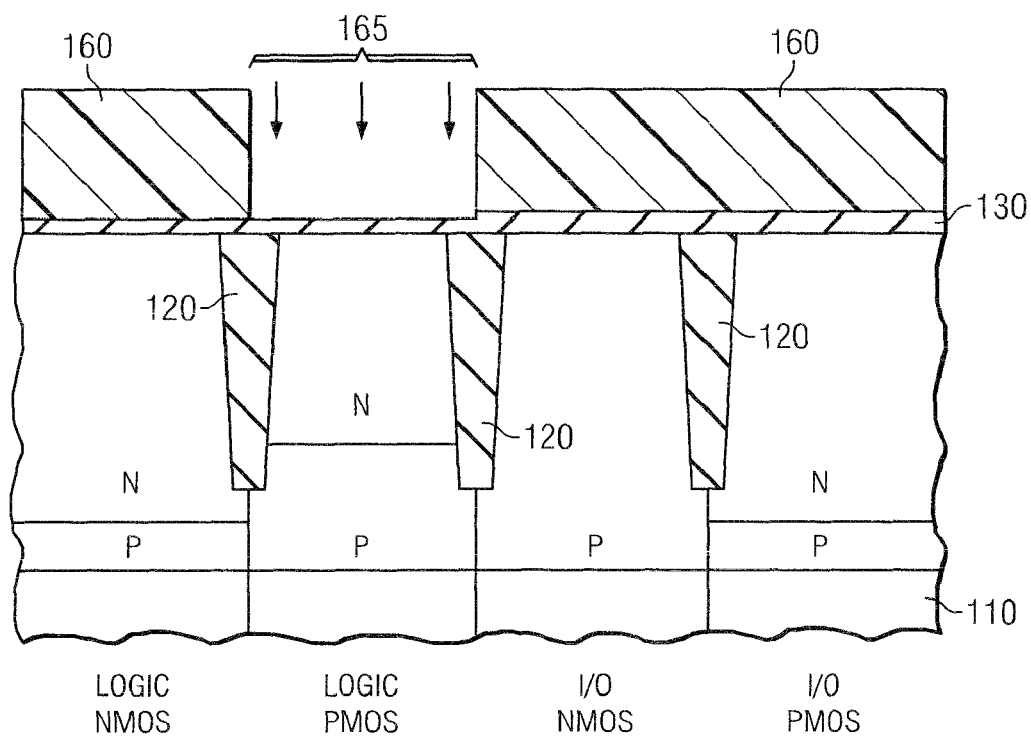

As shown in FIG. 1A, although the logic PMOS and/or I/O PMOS transistors can also receive the P-type implants, these P-type implants can be compensated by subsequent N-type implants, for example, as shown in FIG. 1B and FIG. 1C.

In embodiments, the threshold voltage ($V_T$) of the I/O PMOS transistor can be set and/or adjusted, for example, by an I/O PMOS $V_T$ implant in the I/O PMOS transistor. In one embodiment, as shown in FIG. 1B, a photo-resist 150 can be deposited and patterned to cover the logic PMOS transistor and the I/O NMOS transistor, and to expose the I/O PMOS transistor and the logic NMOS transistor. An N-type implant can be applied at 155 to the exposed regions of the I/O PMOS transistor and the logic NMOS transistor.

As a result, a deep NWELL (i.e., DNWELL) can be formed in the logic NMOS transistor as similarly performed in conventional triple well CMOS process. In embodiments, the deep NWELL implant can be a light compensation N-type implant, which can in turn be compensated by following heavy P-type well/channel stop implants in the logic NMOS transistor.

Figure 2B:
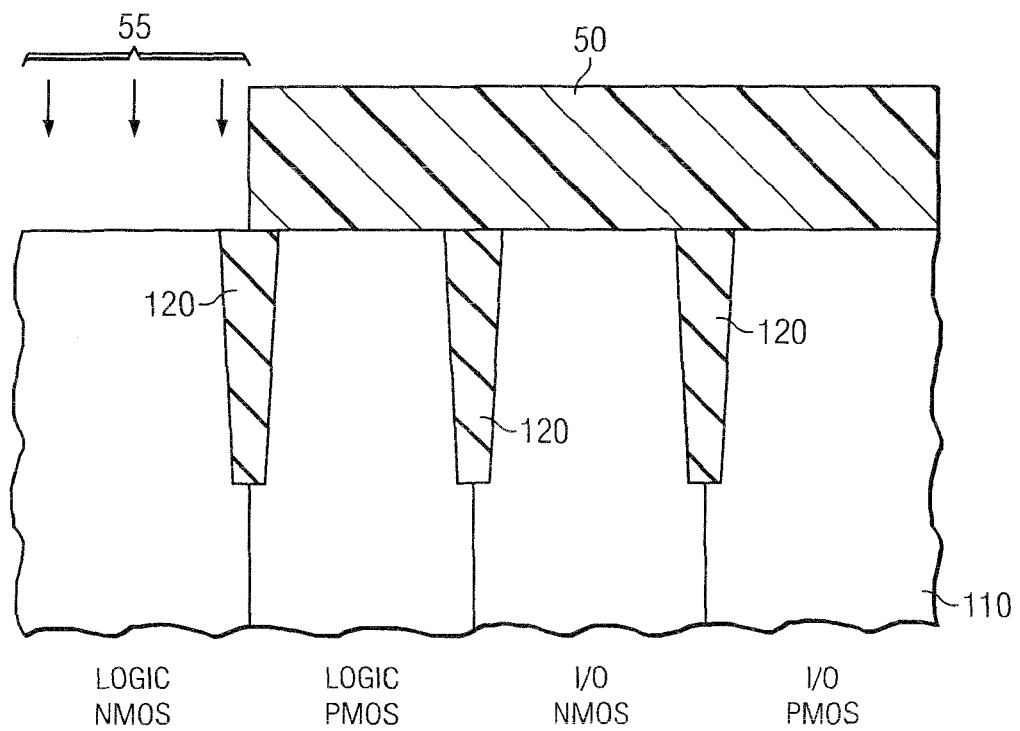

By using a conventionally existing DNWELL mask, the photo-resist 150 can also open the DNWELL formation to the I/O PMOS transistor. This differs from the corresponding conventional manufacturing step as seen in FIG. 2B, where conventional I/O PMOS transistor as well as the logic PMOS transistor and the I/O NMOS transistor are covered by a photo-resist 50, exposing only the logic NMOS region to form the DNWELL in the logic NMOS transistor.

As disclosed herein, the deep NWELL implant can be an I/O PMOS $V_T$ implant to set the $V_T$ of the I/O PMOS transistor to a desired $V_T$ level. For example, the deep NWELL implant can be performed with a dose ranging from about 1e13 atoms/cm$^2$ to about 2e13 atoms/cm$^2$ at an energy ranging from about 500 keV to about 700 KeV.

The DNEWLL implant can be selected to be sufficient for setting the I/O PMOS transistor to the desired $V_T$. Meanwhile, this DNEWLL implant can be selected to be light enough to have no or little impact on the threshold voltage of other transistors in the chip including the I/O NMOS transistor, the logic PMOS transistor, and/or the logic NMOS transistor. For example, the implant dose used for forming the DNWELL in the I/O PMOS transistor and the logic NMOS transistor (see FIG. 1B) can be significantly lower than the implant dose for subsequently forming PWELL and/or P-channel (see FIG. 1D) in the logic NMOS transistor. Specifically, as will be described with respect to FIG. 1D, the subsequent PWELL formation in the logic NMOS substrate can use an implant dose of about 5e12 atoms/cm$^2$ or greater.

In some embodiments, an additional surface N-type implant can be performed to adjust the $V_T$ of the I/O PMOS transistor set by the DNWELL implant in FIG. 1B. In embodiments, the threshold voltage ($V_T$) of the I/O PMOS transistor can be set and/or adjusted to a desired level ranging from about −0.2V to about −1.0V, or from −0.2V to about −0.7V, or from −0.3V to about −1.0V.

In this manner, the threshold voltage $V_T$ for each of the I/O NMOS transistor and the I/O POMS transistor can be set and/or adjusted to a desirable level without using any additional masks. The I/O NMOS transistor and the I/O POMS transistor each with suitable $V_T$ can then be masked during the following formation of the disclosed dual supply voltage CMOS device. As such, formation and $V_T$ control of logic transistors can be separated from I/O transistors. For example, channels and wells can be formed in the logic NMOS and PMOS transistors by conventional masking and implanting processes, but with the I/O transistors masked, as exemplarily shown in FIGS. 1C-1D.

In FIG. 1C, after removal of the photo-resist 150, another photo-resist 160 can be deposited and patterned, for example, to cover the I/O NMOS transistor, the I/O PMOS transistor, and the logic NMOS transistor. The photo-resist 160 can expose the logic PMOS transistor to perform a standard NWELL pattern in the P-region of the logic PMOS transistor.

Figure 2C:
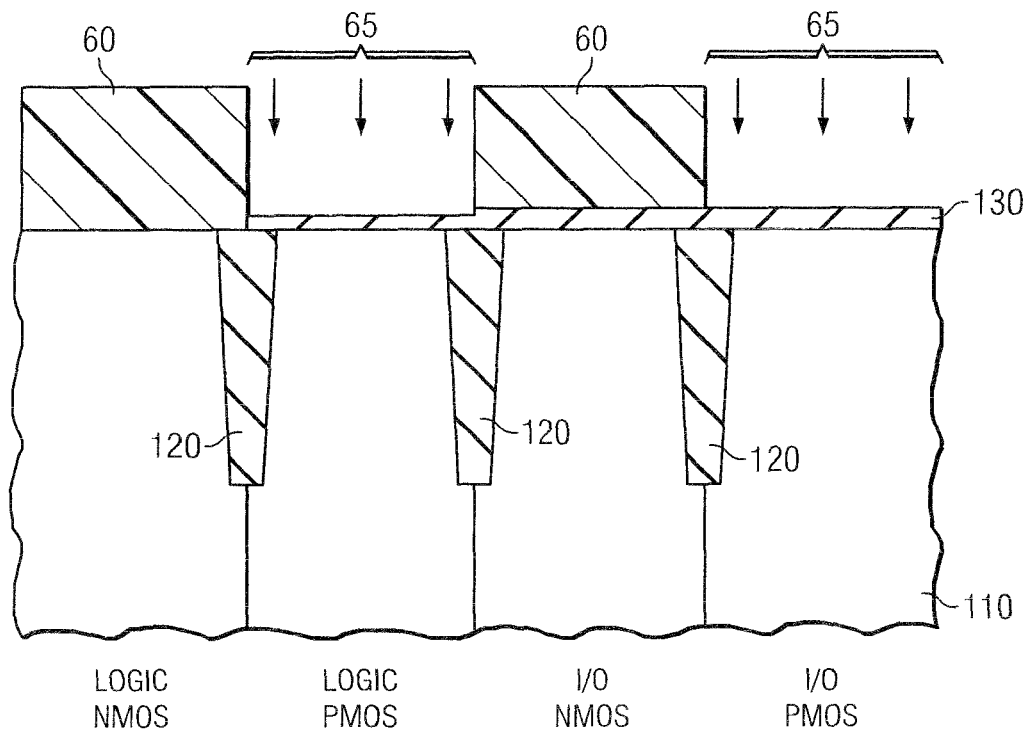

As compared with the conventional method shown in FIG. 2C, when standard NWELL pattern is performed to form the logic PMOS transistor, the I/O PMOS transistor is also exposed to the NWELL implant by a photo-resist 60.

Figure 1D:
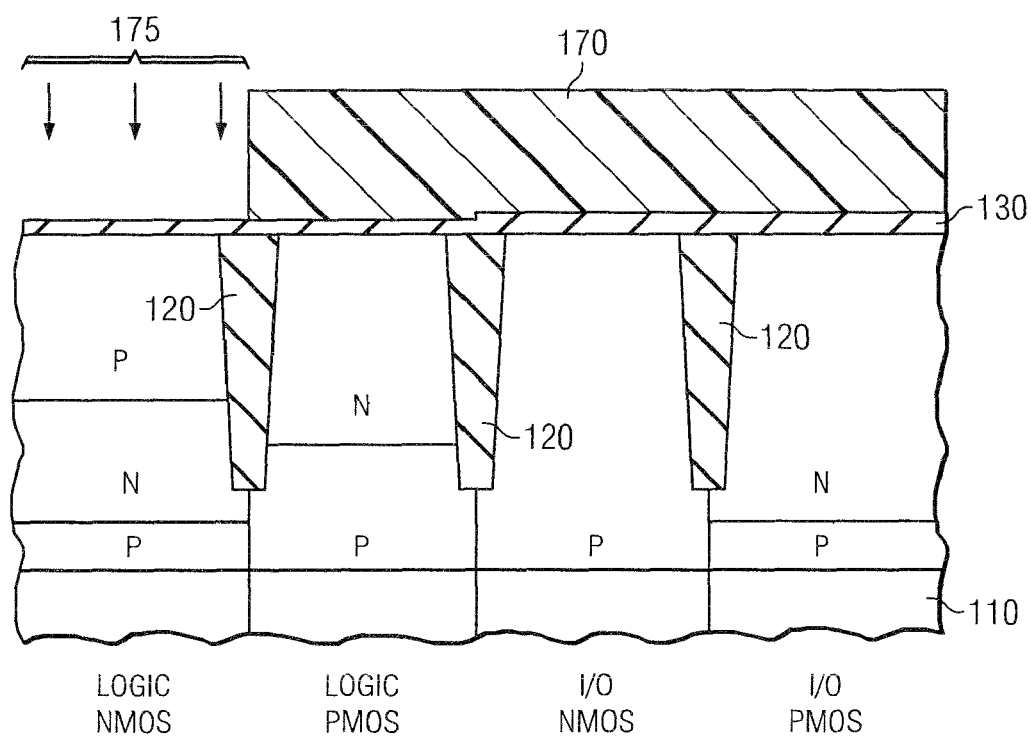

In FIG. 1D, after removal of the photo-resist 160 for the NWELL pattern in FIG. 1C, a third photo-resist 170 can be deposited and patterned, for example, to cover the I/O NMOS transistor, the I/O PMOS transistor, and the logic PMOS transistor. The photo-resist 170 can expose the logic NMOS to perform a standard PWELL pattern in the deep NWELL region of the logic NMOS transistor.

Figure 2D:
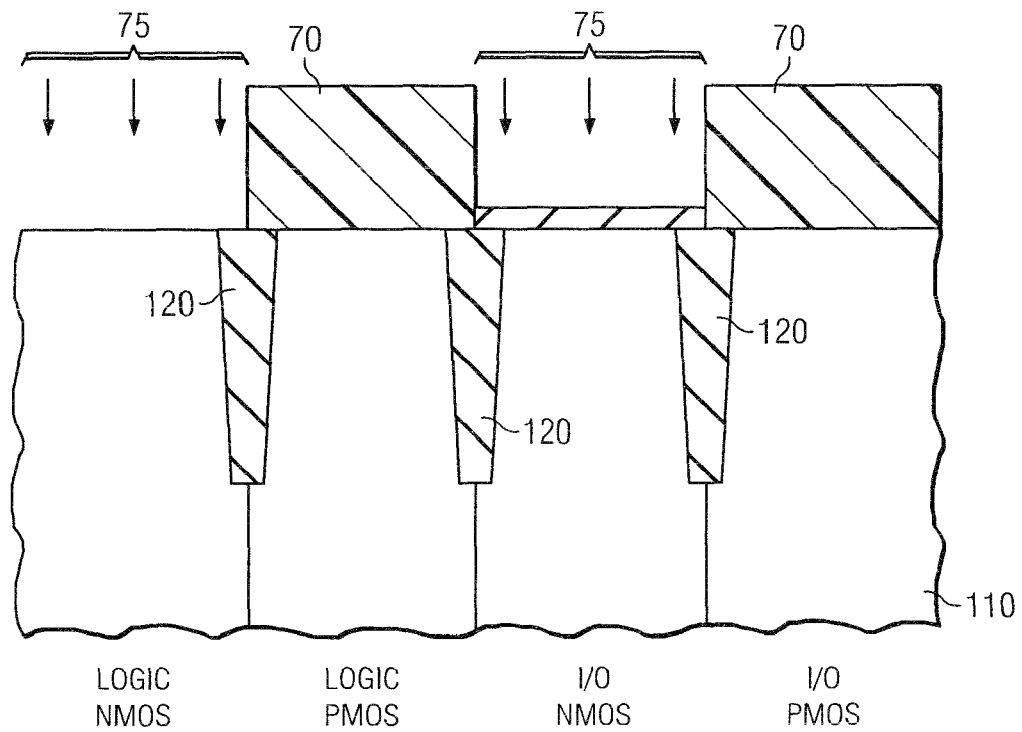

For comparison, when the PWELL pattern is performed in the conventional logic NMOS transistor by using a photo-resist 70 shown in FIG. 2D, the I/O NMOS transistor is also exposed to the PWELL implant. This exposure of the I/O NMOS transistor can affect the threshold voltage of the I/O NMOS transistor that is already set or adjusted.

In embodiments, to complete the formation of the disclosed dual voltage supply CMOS device, a portion associated with logic transistors of the oxide layer 130 can then be etched off. A gate dielectric, either oxide or nitrided oxide, can be grown. A polysilicon or metal gate can then be formed. Generally, all gates can be a single layer of polysilicon, although differently doped layers can be used to form the PMOS and NMOS gates.

In embodiments, the formation of transistors can be continued to include channel implants, sidewall spacer formation, source/drain implants, silicide formation on the gate and on the source/drain areas, deposition of a dielectric and/or metallization, etc., as known to one of ordinary skill in the art.

In embodiments, the N-type implants or NWELL formation can use various dopants including, for example, phosphorous, silicon, germanium, selenium, sulfur and/or tellurium, while the P-type implants or PWELL formation can use dopants including, for example, boron, beryllium, strontium, barium, zinc, and/or magnesium. Other dopants known to one of ordinary skill in the art can also be used. In embodiments, the location and/or formation order of the N-type and P-type regions can be reversed for the disclosed CMOS devices.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in non-conformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a CMOS transistor comprising:
providing a semiconductor substrate comprising isolated regions of a logic NMOS transistor, a logic PMOS transistor, an I/O NMOS transistor, and an I/O PMOS transistor;
setting a threshold voltage (VT) of the I/O NMOS transistor by implanting a P-type dopant in the I/O NMOS transistor;
setting a threshold voltage (VT) of the I/O PMOS transistor by masking the logic PMOS transistor and the I/O NMOS transistor and implanting an N-type dopant in the I/O PMOS transistor and the logic NMOS transistor to form a deep NWELL in both the logic NMOS transistor and the I/O PMOS transistor;
masking both the I/O NMOS transistor with the set VT and the I/O PMOS transistor with the set VT to form an NWELL region in the logic PMOS transistor; and
masking both the I/O NMOS transistor with the set VT and the I/O PMOS transistor with the set VT to form a PWELL region in the logic NMOS transistor.

2. The method of claim 1, wherein setting the threshold voltage ($V_T$) of the I/O NMOS transistor further comprises blanket implanting the P-type dopant in each of the logic NMOS transistor, the logic PMOS transistor, the I/O PMOS transistor and the I/O NMOS transistor.

3. The method of claim 2, wherein the step of blanket implanting the P-type dopant uses an implant dose ranging from about 1e12 atoms/cm$^2$ to about 1e13 atoms/cm$^2$ at an energy ranging from about 300 keV to about 500 KeV.

4. The method of claim 2 further comprising adjusting the set $V_T$ of the I/O NMOS transistor by an additional surface implant of the P-type dopant.

5. The method of claim 2, wherein the $V_T$ of the I/O NMOS transistor is set to range from about 0.2V to about 1.0V.

6. The method of claim 1, wherein forming the deep NWELL uses an implant dose ranging from about 1e13 atoms/cm$^2$ to about 2e13 atoms/cm$^2$ at an energy ranging from about 500 keV to about 700 KeV.

7. The method of claim 1 further comprising adjusting the set VT of the I/O PMOS transistor by an additional surface implant of the N-type dopant.

8. The method of claim 1, wherein the VT of the I/O PMOS transistor is set to range from about −0.2V to about −1.0V.

9. The method of claim 1 further comprising masking the I/O NMOS transistor with the set $V_T$, the I/O PMOS transistor with set $V_T$, and the logic NMOS transistor to form the NWELL region in the logic PMOS transistor.

10. The method of claim 1 further comprising masking the I/O NMOS transistor with the set $V_T$, the I/O PMOS transistor with the set $V_T$, and the logic PMOS transistor to form the PWELL region in the logic NMOS transistor.

11. A method of fabricating a CMOS transistor comprising:
providing a semiconductor substrate comprising isolated regions of a logic NMOS transistor, a logic PMOS transistor, an I/O NMOS transistor, and an I/O PMOS transistor;
blanket implanting a P-type dopant in each isolated region of the semiconductor substrate to set a threshold voltage (VT) of the I/O NMOS transistor to about 0.3V to about 1.0V using an implant dose ranging from greater than 1e12 to about 1e13 atoms/cm$^2$;
masking both the logic PMOS transistor and the I/O NMOS transistor; and
implanting an N-type dopant in the I/O PMOS transistor to set a threshold voltage (VT) of the I/O PMOS transistor further comprises forming a deep NWELL in the logic NMOS transistor;
masking the I/O NMOS transistor with the set VT, the I/O PMOS transistor with the set VT, and the logic NMOS transistor to form an NWELL region in the logic PMOS transistor; and
masking the I/O NMOS transistor with the set VT, the I/O PMOS transistor with the set VT, and the logic PMOS transistor to form a PWELL region in the logic NMOS transistor.

12. The method of claim 11, wherein implanting the N-type dopant in the I/O PMOS transistor to set the $V_T$ of the I/O PMOS transistor uses an implant dose ranging from about 1e13 atoms/cm$^2$ to about 2e13 atoms/cm$^2$ at an energy ranging from about 500 keV to about 700 KeV.

13. The method of claim 11, wherein the threshold voltage ($V_T$) of the I/O PMOS transistor is set to range from about −0.2V to about −1.0V.

14. The method of claim 11 further comprising using an implant dose of about 5e12 atoms/cm$^2$ or greater to form the PWELL region in the logic NMOS transistor.

15. A method of fabricating a CMOS transistor comprising:
providing a semiconductor substrate comprising isolated regions of a logic NMOS transistor, a logic PMOS transistor, an I/O NMOS transistor, and an I/O PMOS transistor;
blanket implanting boron in each isolated region of the semiconductor substrate to set a threshold voltage ($V_T$) of the I/O NMOS transistor;
optionally adjusting the set $V_T$ of the I/O NMOS transistor by a surface boron implant;
masking both the logic PMOS transistor and the I/O NMOS transistor, and forming a deep NWELL in both the logic NMOS transistor and the I/O PMOS transistor to set a threshold voltage ($V_T$) of the I/O PMOS transistor;
optionally adjusting the set $V_T$ of the I/O PMOS transistor by a surface N-type implant;
masking the I/O NMOS transistor with the set $V_T$, the I/O PMOS transistor with the set $V_T$, and the logic NMOS transistor to form an NWELL region in the logic PMOS transistor; and
masking the I/O NMOS transistor with the set $V_T$, the I/O PMOS transistor with the set $V_T$, and the logic PMOS transistor to form a PWELL region in the logic NMOS transistor.

16. The method of claim 15, wherein forming the deep NWELL in both the logic NMOS transistor and the I/O PMOS transistor to set the $V_T$ of the I/O PMOS transistor uses an implant dose ranging from about 1e13 atoms/cm$^2$ to about 2e13 atoms/cm$^2$, and wherein the PWELL region formed in the logic NMOS transistor uses an implant dose of about 5e12 atoms/cm$^2$ or greater.

* * * * *